US012568605B2

(12) United States Patent
Sologubenko et al.

(10) Patent No.: US 12,568,605 B2
(45) Date of Patent: Mar. 3, 2026

(54) LOOP HEAT PIPE FOR LOW VOLTAGE DRIVES

(71) Applicant: ABB Schweiz AG, Baden (CH)

(72) Inventors: Oleksandr Sologubenko, Bonstetten (CH); Daniele Torresin, Baden (CH); Andrey Petrov, Zurich (CH); Bruno Agostini, Zurich (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/336,323

(22) Filed: Jun. 2, 2021

(65) Prior Publication Data

US 2021/0385973 A1 Dec. 9, 2021

(30) Foreign Application Priority Data

Jun. 3, 2020 (EP) ..................................... 20178093

(51) Int. Cl.
*H05K 7/20* (2006.01)
*F28D 15/02* (2006.01)
(Continued)

(52) U.S. Cl.
CPC ..... *H05K 7/20336* (2013.01); *F28D 15/0266* (2013.01); *F28D 15/0275* (2013.01);
(Continued)

(58) Field of Classification Search
CPC ... F24T 10/40; F24T 2010/56; F28D 15/0266; F28D 15/04; F28D 2015/0216;
(Continued)

(56) References Cited

U.S. PATENT DOCUMENTS 4,274,479 A * 6/1981 Eastman ............... F28D 15/046
29/890.032
5,253,702 A * 10/1993 Davidson ............ F28D 15/0266
29/890.032
(Continued)

FOREIGN PATENT DOCUMENTS

CN 1556911 A 12/2004
CN 1703142 A 11/2005
(Continued)

OTHER PUBLICATIONS

Stépane Launay, et al., "Parametric analysis of loop heat pipe operation: a literature review", International Journal of Thermal Sciences, Dec. 20, 2006, pp. 621-636, vol. 46, Elsevier, Amsterdam, Netherlands.
(Continued)

*Primary Examiner* — Gordon A Jones
(74) *Attorney, Agent, or Firm* — Fitch Even Tabin & Flannery LLP

(57) ABSTRACT

A loop heat pipe includes: an evaporator having an enclosure with a heat receiving side and side walls with openings forming an evaporator chamber, the evaporator chamber including a primary capillary structure adjacent to the heat receiving side of the enclosure and extending to the side walls of the evaporator chamber, a plurality of grooves in the primary capillary structure, each of which extends from an opening in one of the side walls to an opening in an opposite side wall, the plurality of grooves transporting vapor from the primary capillary structure to the openings; and a condenser.

18 Claims, 4 Drawing Sheets

(51) Int. Cl.
  *F28D 15/04* (2006.01)
  *F28F 1/12* (2006.01)
(52) U.S. Cl.
  CPC .............. *F28D 15/046* (2013.01); *F28F 1/12* (2013.01); *H05K 7/20309* (2013.01); *H05K 7/20318* (2013.01); *H05K 7/20936* (2013.01)
(58) Field of Classification Search
  CPC ......... H01L 23/00; H01L 23/427; H05K 7/00; H05K 7/20336
  See application file for complete search history.

(56) References Cited

U.S. PATENT DOCUMENTS

| | | | |
|---|---|---|---|
| 6,382,309 B1 | 5/2002 | Kroliczek | |
| 6,880,626 B2* | 4/2005 | Lindemuth | F28D 15/0233 174/15.2 |
| 7,661,464 B2* | 2/2010 | Khrustalev | F28D 15/0266 165/104.21 |
| 8,584,740 B2 | 11/2013 | Figus | |
| 8,622,118 B2 | 1/2014 | Wang et al. | |
| 8,737,071 B2* | 5/2014 | Hao | H05K 7/20 174/15.1 |
| 8,780,560 B2* | 7/2014 | Ogata | F28D 15/046 174/15.2 |
| 11,058,032 B2* | 7/2021 | Gaskill | B23P 15/26 |
| 11,085,703 B2* | 8/2021 | Watanabe | F28D 15/0233 |
| 11,382,238 B2* | 7/2022 | Takagi | H05K 7/20309 |
| 2004/0022529 A1* | 2/2004 | Lamb | D06F 58/16 392/485 |
| 2004/0037045 A1* | 2/2004 | Phillips | F28D 15/0233 361/719 |
| 2004/0163798 A1* | 8/2004 | Ghosh | F28F 1/40 165/104.21 |
| 2005/0173098 A1* | 8/2005 | Connors | F28D 15/0233 165/104.21 |
| 2007/0187071 A1* | 8/2007 | Miyagawa | F28D 15/0266 165/104.21 |
| 2008/0164010 A1 | 7/2008 | Kang et al. | |
| 2009/0084526 A1* | 4/2009 | Chang | F28D 15/046 165/104.26 |
| 2009/0159243 A1* | 6/2009 | Zhao | F28D 15/046 165/104.26 |
| 2010/0044014 A1 | 2/2010 | Ho | |
| 2010/0163212 A1 | 7/2010 | Chin | |
| 2011/0088875 A1 | 4/2011 | Hou | |
| 2012/0120604 A1 | 5/2012 | Hao et al. | |
| 2012/0247736 A1* | 10/2012 | Xiang | F28D 15/0266 165/104.26 |
| 2012/0273167 A1* | 11/2012 | Xiang | H01L 23/427 165/104.26 |
| 2012/0312506 A1 | 12/2012 | Uchida et al. | |
| 2013/0044432 A1* | 2/2013 | Ogata | H05K 7/20336 165/104.26 |
| 2013/0083482 A1* | 4/2013 | Uchida | F28D 15/046 165/104.26 |
| 2014/0090814 A1* | 4/2014 | Kondou | H01L 23/427 165/104.21 |
| 2014/0352927 A1* | 12/2014 | Agostini | F28D 15/0266 165/104.21 |
| 2015/0338171 A1* | 11/2015 | Torres Sepúlveda | F28D 15/043 165/104.26 |
| 2017/0356694 A1* | 12/2017 | Tan | F28D 15/0266 |
| 2019/0075682 A1* | 3/2019 | Shioga | F28D 15/0233 |
| 2019/0094295 A1* | 3/2019 | Wolff | G01R 31/2874 |
| 2019/0264989 A1 | 8/2019 | Kurashima | |
| 2020/0173730 A1* | 6/2020 | Watanabe | F28D 15/0275 |
| 2020/0386489 A1* | 12/2020 | Baba | F28D 15/0266 |

FOREIGN PATENT DOCUMENTS

| | | |
|---|---|---|
| CN | 101013011 A | 8/2007 |
| CN | 101135268 A | 3/2008 |
| CN | 101144694 A | 3/2008 |
| CN | 101307996 A | 11/2008 |
| CN | 102269534 A | 12/2011 |
| CN | 102486355 A | 6/2012 |
| CN | 102865762 A | 1/2013 |
| CN | 202915780 U | 5/2013 |
| CN | 204404869 U | 6/2015 |
| CN | 104864376 A | 8/2015 |
| CN | 106225539 A | 12/2016 |
| CN | 106949763 A | 7/2017 |
| CN | 109210607 A | 1/2019 |
| CN | 110108141 A | 8/2019 |
| EP | 2157391 A1 | 2/2010 |
| TW | M282236 U | 12/2005 |
| TW | 201000843 A | 1/2010 |
| WO | WO 2018073992 A1 | 4/2018 |

OTHER PUBLICATIONS

Stépane Launay, et al., "State-of-the-art Experimental Studies on Loop Heat Pipes", Frontiers in Heat Pipes (FHP), Mar. 2011, pp. 1-27, vol. 2., No. 1, Global Digital Central, USA.

Yu. F. Maydanik, "Loop heat pipes", Applied Thermal Engineering, Sep. 25, 2004, pp. 635-657, vol. 25, Elsevier, Amsterdam, Netherlands.

Yu. F. Maydanik, et al., "Loop heat pipes with flat evaporators", Applied Thermal Engineering, Mar. 26, 2014, pp. 294-307, vol. 67, Elsevier, Amsterdam, Netherlands.

* cited by examiner

LOOP HEAT PIPE FOR LOW VOLTAGE DRIVES

CROSS-REFERENCE TO PRIOR APPLICATION

Priority is claimed to European Patent Application No. EP 20 178 093.9, filed on Jun. 3, 2020, the entire disclosure of which is hereby incorporated by reference herein.

FIELD

The present invention relates to a loop heat pipe, the use of a loop heat pipe, and an electric power device comprising a loop heat pipe.

BACKGROUND

Thermal management is an important aspect of today's size- and cost-optimized electric power devices. Making power electronic equipment more compact or increasing its current rating typically increases the demands on cooling.

Among available advanced cooling techniques for, e.g., cooling electric power devices, two-phase capillary thermal control devices such as heat pipes, vapor chambers, capillary pumped loops, and loop heat pipes (LHP) are especially promising. Two-phase loops offer advantages over heat pipes and vapor chambers in terms of operation against gravity, maximum heat transport capability, and smooth walled flexible transport lines.

Heat pipes and vapor chambers, being two-phase devices, improve heat dissipation considerably, but the fact that in such devices the vapor and the liquid circulate in the same volume in the opposite directions and so hamper each other, imposes one of the limits in the cooling performance. Loop heat pipe systems are free from this limitation, since they have dedicated lines for the vapor and the liquid. In conventional CLHP, the produced vapor is typically collected in a single vapor line that carries the vapor to the condenser area. This is associated with considerable minor and friction pressure losses, which dominate the total pressure losses and, therefore, largely determine the maximum fluid flow rate and limit the cooling performance.

SUMMARY

In an embodiment, the present invention provides a loop heat pipe, comprising: an evaporator comprising an enclosure with a heat receiving side and side walls with openings forming an evaporator chamber, the evaporator chamber comprising a primary capillary structure adjacent to the heat receiving side of the enclosure and extending to the side walls of the evaporator chamber, a plurality of grooves in the primary capillary structure, each of which extends from an opening in one of the side walls to an opening in an opposite side wall, the plurality of grooves being configured to transport vapor from the primary capillary structure to the openings; and a condenser.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
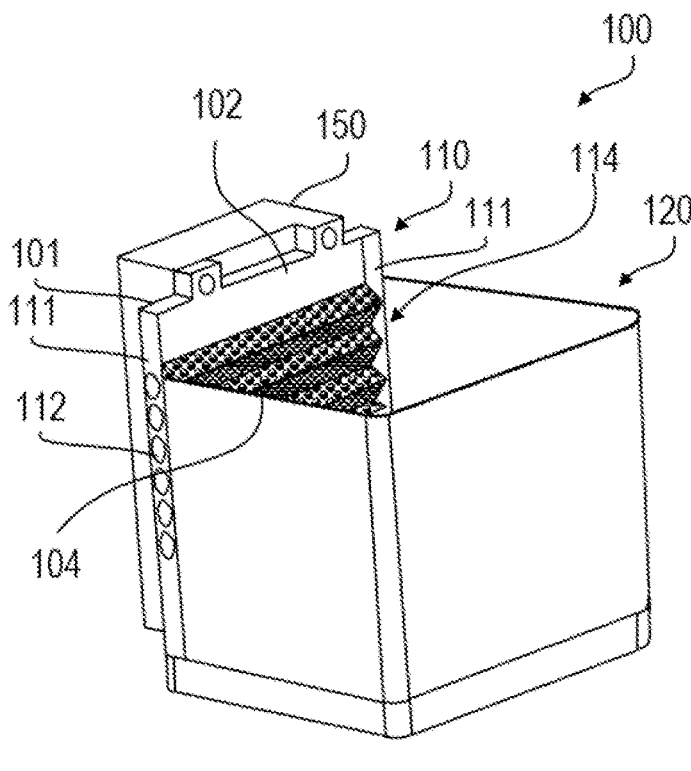
FIG. 1 shows a schematic diagram of an overall view of the loop heat pipe.

In an embodiment, the present invention provides a cooling unit with an improved cooling performance.

The described embodiments similarly pertain to the loop heat pipe, the method for determining liquid properties of a medium, the use of the measurement system, the use of the loop heat pipe, and the electric power device. Synergetic effects may arise from different combinations of the embodiments although they might not be described in detail.

Technical terms are used by their common sense. If a specific meaning is conveyed to certain terms, definitions of terms will be given in the following in the context of which the terms are used According to a first aspect, a loop heat pipe is provided, comprising an evaporator with an enclosure, an evaporator chamber, a primary capillary structure, a plurality of grooves in the primary capillary structure, and a condenser. The enclosure of the loop heat pipe has a heat receiving side and side walls with openings forming the evaporator chamber. The evaporator chamber comprises a primary capillary structure such as a wick adjacent to the heat receiving side of the enclosure and extending to the side walls of the evaporator chamber. Each of the plurality of grooves in the primary capillary structure extends from an opening in one of the side walls to an opening in the opposite side wall and is configured to transport vapor from the primary capillary structure to the openings. I.e., each of the grooves may conduct the vapor produced in the groove to an corresponding openings to that groove at two side walls of the evaporator chamber. Thus, a design of a loop heat pipe cooling unit is suggested, where each groove of the primary capillary structure has a dedicated vapor line which carries the vapor to the cold area with minimum flow resistance.

According to an embodiment, a condenser with a plurality of paths, each path having an inlet and the loop heat pipe further comprises a plurality of vapor ducts connected to the evaporator and the condenser. The plurality of vapor ducts is configured to conduct the vapor from the openings to the inlets of the condenser paths, and the condenser paths are configured to receive the vapor at the inlets, to condense the vapor, and to conduct the condensed vapor as subcooled liquid to the evaporator.

In other words, the condenser comprises a plurality of condensation sections, which also act as compensation chambers. That is, each of the paths forms one or more compensation chambers which compensate the liquid for the liquid evaporating in the primary capillary structure. In this way, the condensation and compensation are distributed, e.g. in a sort of 3D-matrix over a scalable volume of the condenser. That is, for example, the number of primary wick grooves, vapor ducts, and condensation chambers may be varied according to the requirements of the usage and system. By providing multiple vapor ducts the fluid flow resistance is reduced, thereby extending the operating range of fluid flow and, therefore, increasing cooling capacity.

Similarly to the grooves in the primary wick, this keeps the pressure losses low and increases the capacity of the vapor stream and liquid flow, respectively, and further provides contemporarily preconditions for effectively dissipate the heat into the ambient, as described further below. Multiple condensation chambers connected to the same evaporator chamber provide homogeneity of the fluid distribution.

Each of these chambers may be equipped with an extension of the secondary wick to facilitate a homogeneous return of the subcooled liquid to the primary wick. This contrasts to conventional LHP designs associated with a single liquid line and a single compensation chamber, potentially causing unevenness of the subcooled liquid distribution.

According to an embodiment, the evaporator chamber further comprises a secondary capillary structure with a flat portion adjacent to the primary capillary structure and extending to the side walls of the evaporator chamber, wherein the secondary capillary structure is configured to provide subcooled liquid to the primary capillary for compensating evaporated liquid in the primary capillary. The secondary capillary structure receives the liquid from the condensed vapor and provides the liquid to the primary capillary structure for compensating evaporated liquid in the primary capillary. E.g., the loop heat pipe has an orientation such that the paths in the condenser have an inclination so that the condensed vapor flows downwards in direction to the evaporation chamber due to gravity. For example, the loop heat pipe, also denominated loop heat pipe cooling unit in this disclosure, is oriented such that the evaporator is the bottom side of the loop heat pipe and the paths in the condenser are oriented perpendicular to the evaporator in an up-down direction. However, if there is no sufficient gradient, the second capillary structure may be extended as described for the following embodiment.

According to an embodiment, the secondary capillary structure of the evaporator chamber further comprises a path intruding portion extending pin-like from the flat portion of secondary capillary structure into the plurality of paths. This intruding portion effects the reception of the condensed vapor in the compensation chambers. The liquid generated in the compensation chambers is conducted via the pin-like portion over the flat portion of secondary capillary structure to the primary capillary structure in the evaporation chamber due to a different structure of the primary and secondary capillary structures and pressure differences. This arrangement furthermore facilitates a homogeneous return of the liquid also in case that the paths are oriented horizontally or such that the liquid does no flow to the evaporation chamber by gravity. The condensation chambers' shape and perpendicular cross-section may be varied to facilitate condensation and to reduce the vapor pressure drop.

According to an embodiment, the evaporator comprises support elements for mechanically stabilizing the evaporation chamber. For example, the evaporator chamber has an rectangular shape. Ribs running from one side wall to the other and/or pins may connect the opposite flat walls of the evaporator chamber. The ribs penetrate both the primary and the secondary wick between the grooves, leaving unobstructed the vapor flow in the primary wick grooves. In this way, the mechanical integrity of the evaporator chamber is improved. These structural elements impede bulging of the evaporator chamber that may be caused by forces exerted by an elevated pressure of the working fluid on the large flat walls.

According to an embodiment, the plurality of vapor ducts is arranged in layers surrounding the condenser. The vapor ducts hence form an envelope of the loop heat pipe together with the evaporator. Furthermore, the inlets of the paths are arranged on the opposite side of the evaporator configured to receive the vapor from the vapor ducts. For example, if the evaporator is oriented vertically, i.e., the heat receiving side has a normal vector parallel to the ground, the layers of the vapor ducts lie in planes also parallel to this normal vector. Each vapor duct layer may, for example start on one side wall of the evaporator enclosure, run in a rectangular way along three sides around the condenser paths and end at the other side wall of the evaporator enclosure. All vapor duct layers then form an vertical envelope or a sort of enclosure with open top and bottom sides. The open top and bottom sides may be used to introduce an airflow supporting the cooling of the condenser. "Rectangular" means essentially rectangular. E.g., the corners may be rounded.

According to an embodiment, each vapor duct of the plurality of vapor ducts connects to multiple condensation chambers. The connection may be established via outlet ports of a vapor duct, for example, at the side opposite to the evaporator, and inlet ports of the plurality of condenser paths corresponding to one vapor duct layer.

According to an embodiment, the loop heat pipe further comprises a conduit fluidly connecting vapor ducts with each other. Such conduits may be arranged perpendicular to the vapor duct layer. The perpendicular conduits may, for example, be arranged at the corners of the vapor duct rectangle, located at the opposite of the evaporator. This arrangement and the connection of a vapor duct with multiple condensation chambers allows an even distribution of the vapor.

According to an embodiment, the primary capillary structure is formed by a first porous structure with a first porosity and pores with a first pore size, and the secondary capillary structure is formed by a second porous structure with a second porosity different from the first porosity and pores with a second pore size different from the first pore size. The pore sizes may be specific for the selected working fluid and for the heat load requirements. The pore size of the primary capillary structure is normally smaller than the pore size of the secondary capillary structure.

The correct selection of the capillary structure material is critical for the functionality of the proposed cooling system. The following criteria should be satisfied: The sizes of the primary and secondary wick pores should be small enough for the capillary forces to hold the liquid at the elevation given by the orientation of the cooling unit with respect to gravity. The mean pore radius of a primary wick may be typically selected between 2 and 50 $\mu m$, depending of the choice of the working fluid. There may be cases, where the pore size is out of this range. For example, in case water is the working fluid, the secondary wick radius may be chosen to be as large as 100 $\mu m$. Further, the size of the primary wick pores should be small enough for the capillary forces to perform capillary pumping. On the other side, the size of the wick pores should be large enough and the wick porosity should be high to minimize the flow resistance of the liquid inside the wick. Moreover, good wetting of the wick material by the refrigerant liquid is essential. Furthermore, the material of the wick should have low thermal conductivity to prevent heat flow from the bottom of the evaporator chamber to the secondary wick imbued with subcooled liquid, thus preventing boiling of the liquid inside the inner chamber and reducing the saturated pressure of the fluid.

The refrigerant may be a pure compound or a blend of different refrigerants, provided they satisfy requirements presented above.

According to an embodiment, the loop heat pipe further comprises metallic fins for cooling the condensation chambers. The metallic fins are arranged essentially perpendicular to the paths, i.e., perpendicular to the plane of the vapor conduct layers, and such that airflow along the metallic fins is possible. The airflow may, for example, be provided by an external fan, or a fan attached to the loop heat pipe. Different designs and geometries of the fins for forced air convection evaporator are possible, provided they have a good thermal contact to the condensation chambers.

According to an embodiment, the loop heat pipe further comprises an access port located at the end of the conduit. The access port allows for charging refrigerant into the heat pipe. Such an access port may be provided at each conduit in case of having more than one conduit. A specific amount of refrigerant, i.e., working fluid must be charged into the cooling system, i.e. the loop heat pipe cooling unit, sufficient to produce an uninterrupted circulation of the liquid and the vapor in all ambient conditions and all nominal heat loads. A specific procedure of initial filling the working fluid into the system, as well as type of sealing the system, may be free to choose. For a given expected range of the device operating conditions, such as ambient temperatures and heat losses to be dissipated, the fluid is selected such that the fluid is compatible with the materials of the cooling unit. The wetting contact angle, i.e., the relation fluid/wick should be minimal, the refrigerant liquid should have low enough viscosity to minimize the flow resistance of the liquid inside the wick, the latent heat of refrigerant evaporation or boiling should be large enough to deliver sufficient cooling capacity, and the vapor pressure should be low enough for not rupturing the evaporator chamber.

Conduits, fluidly connecting the vapor ducts, may be absent in case the base heat flux is relatively even and additive manufacturing is not used. In this case, a charging port should be arranged at suitable locations.

According to an embodiment, the evaporator chamber, the vapor ducts, the condensation chambers, and the conduits form a hermetic system. In this way, no cooling liquid leaves the system, i.e., the loop heat pipe cooling unit, so that a dryout is prevented.

According to a second aspect, a use of the loop heat pipe as described above for cooling an electric power device, for example a transistor or another electronic device, advantageously having a flat heat dissipating side, is provided.

According to a third aspect, an electric power device, comprising a loop heat pipe as described above is provided.

The proposed loop heat pipe cooling system may be manufactured as a single piece including the evaporator chamber, the capillary structure, the complex fluid circulation conduit, and the fins for convective heat exchange with the air flow. In particular, employing additive manufacturing allows to optimise the working fluid vapor flow and the air flow in order to reduce the pressure losses and the overall thermal resistance. Also, additive manufacturing allows to create spatial variations of capillary properties such as porosity and capillary size, thus allowing to optimize the flow of the liquid phase of the working fluid inside the primary and secondary wicks.

The features presented above and other features, aspects and advantages of the present invention will become better understood with reference to the accompanying figures and the following description.

FIG. 1 shows a schematic diagram of the loop heat pipe 100 without condenser and vapor duct details. The loop heat pipe 100 comprises an evaporator 110 surrounded by an enclosure 101 with a heat receiving side, e.g., a bottom side where a heat source 150 may be mounted as shown in FIG. 1. It is assumed that the heat source 150, for example a transistor, has a flat surface, oriented perpendicular to the y-axis. The flat surface is in good thermal contact with a flat bottom of the evaporator chamber 102. The evaporator chamber 102 is a rectangular box with walls, which can withstand the pressure difference between the working fluid and the ambient. The enclosure 101 further comprises side walls 111 with openings 112 forming an evaporator chamber 102. The condenser part 120 of the loop heat pipe 110 is shown as a box. The condenser 120 and its components is described in detail further below. The evaporator chamber 102 comprises a primary wick or capillary structure 104 adjacent to the heat receiving side of the enclosure 101. The primary capillary structure 104 extends to the side walls 111 of the evaporator chamber 102 and comprises a plurality of grooves 114, each of which extends from an opening 112 in one of the side walls 111 to an opening in the opposite side wall 111. The grooves 114 are configured to transport vapor from the primary capillary structure 104 to the openings 112.

Figure 2:
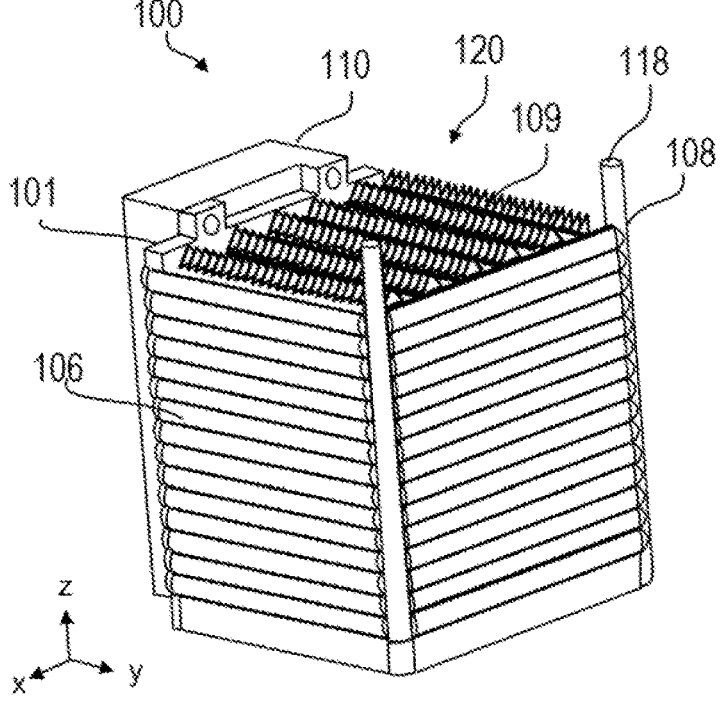
FIG. 2 shows a further schematic diagram of the loop heat pipe.
Figures 5A, 5B:
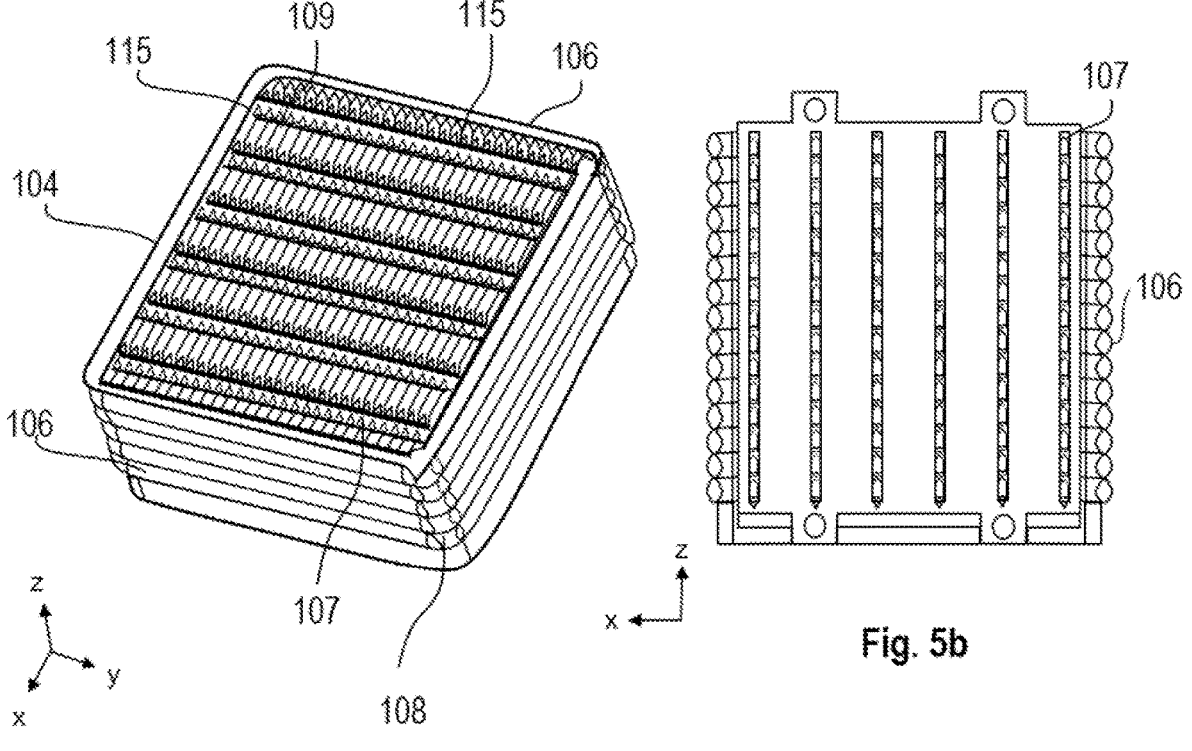
FIG. 5a shows a schematic diagram of a cross-section of the condenser perpendicular to the z-axis.
FIG. 5b shows a schematic diagram of a cross-section of the condenser perpendicular to the y-axis.

FIG. 2 in combination with FIGS. 5a-5b show shows a further schematic diagram of the loop heat pipe 100 corresponding to the loop heat pipe 100 in FIG. 1. Additionally, vapor ducts 106 in layers surrounding the condenser 120 are shown, conduits 108 fluidly connecting vapor ducts 106 with each other, and metallic fins 109 that are arranged essentially perpendicular to the paths (not visible in FIG. 2) and such that airflow along the metallic fins 109 is possible. The vapor ducts 106 and the evaporator 101 hence form an envelope with open top and bottom sides around the condenser. Furthermore, access ports 118 located at the ends of conduits 108 are depicted.

Figures 3A, 3B, 3C:
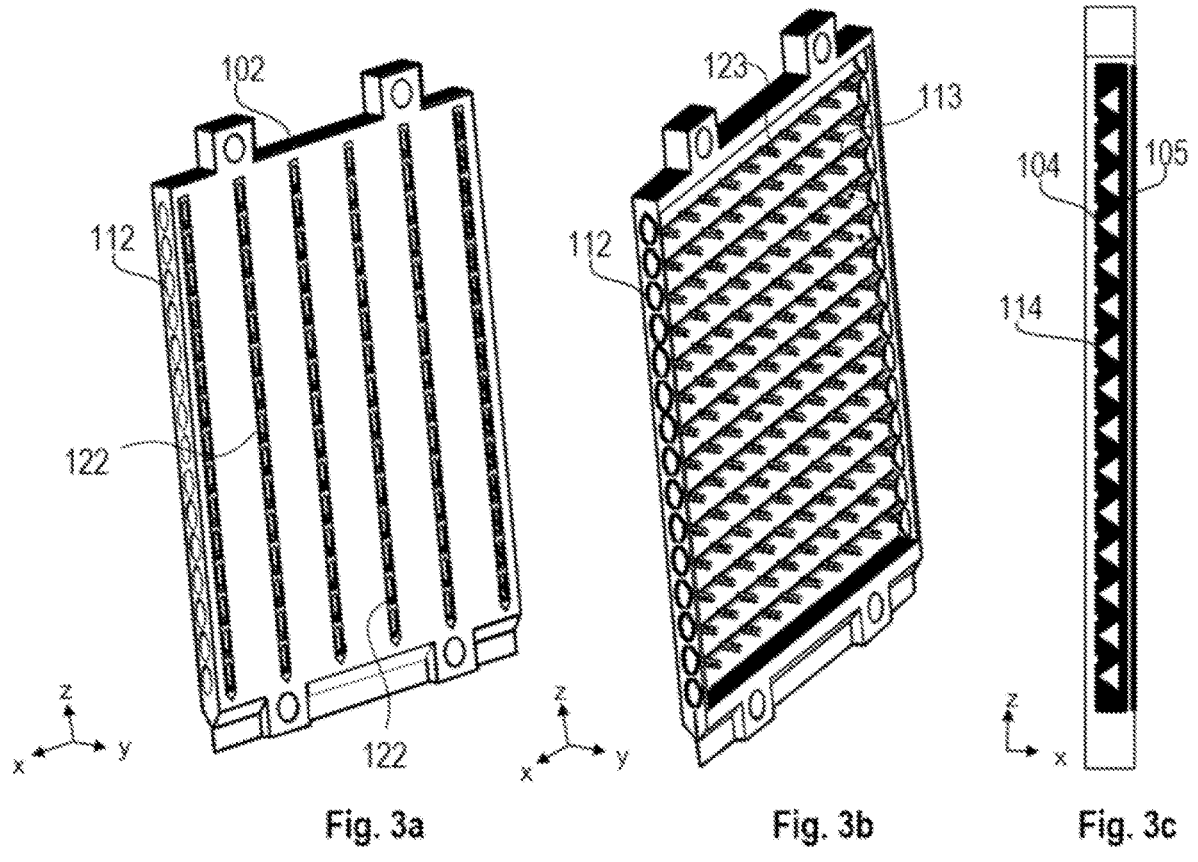
FIG. 3a shows a schematic diagram of the evaporator chamber.
FIG. 3b shows a schematic diagram of an internal structure of the evaporator chamber.
FIG. 3c shows a schematic diagram of a cross-section of the evaporator perpendicular to the x-axis.

FIGS. 3a, 3b, and 3c show a schematic diagram of the evaporator chamber, a schematic diagram of an internal structure of the evaporator chamber 102 without primary capillary structure 104, and a schematic diagram of a cross-section of the evaporator perpendicular to the x-axis, the evaporator 101.

To improve the mechanical integrity of the evaporator chamber 102, a number of ribs 113 and pins 123 connect the opposite flat walls of the evaporator chamber 102, as illustrated in FIG. 3b. The ribs 113 penetrate both the primary 104 and the secondary wick 105 between the grooves 114, leaving unobstructed the vapor flow in the primary wick grooves 114.

Each yz-side of the evaporator chamber box 102 has a regular array of openings 112. The xz-side of the evaporator chamber 102, opposite to the heat source 150, has several arrays of openings 122 for the condensation chambers 107.

Inside of the evaporator chamber 102, there is a primary wick 104 and a secondary wick 105, sandwiched inside the chamber 102 and extending to the walls 111 of the evaporator chamber. Both wicks 104, 105 have porous structures with different pore sizes and porosities, specific for the selected working fluid and for the heat load requirements. The pore size of the primary wick 104 is normally smaller than the pore size of the secondary wick 105. On the side of the primary wick 104 adjacent to the heat source 150, there is an array of grooves 114 along the x-axis. The number of grooves 114 is equal to the number of openings 112 on the yz-walls 111 of evaporator chamber 102; the cross-section shape and area of a groove 114 are determined by the heat load requirements and the requirements of printability in case of 3D-printed LHP. Each groove 114 extends between two openings 112 at the opposing yz-walls 111 of the evaporator chamber 102. Each opening 112 is connected to a dedicated duct 106 which transports the vapor and distributes it between condensation chambers 107. Each vapor duct 106 connects to multiple condensation chambers 107, all leading the condensate to the same secondary wick 105. The bottom of each condensation chamber 107 features a layer of secondary wick 115, which facilitate returning of the liquid to the primary wick 104. Since the condensation chambers 107 collect subcooled liquid, they also play the role of multiple compensation chambers.

The vapor ducts 106 are fluidly connected via conduits 108, which allow vapor exchange between vapor ducts 106. This facilitates a more even distribution of vapor between condensation chambers 107, when (a) the base heat flux is strongly inhomogeneous leading to unequal vapor production in individual evaporator grooves 114, and (b) the heat exchange between the condensation chambers 107 and the air flow is uneven, for example, between the air inlet and the air outlet. The conduits 108 are also used for charging refrigerant and, in case of additive manufacturing, for removing the metallic powder from the internal volume of the loop heat pipe system.

The evaporator chamber 102, the vapor ducts 106, the condensation chambers 102, and the conduits 108 form a hermetic system. The refrigerant is charged into this system by means of access ports 118 located at the ends of conduits 108.

The cooling of the vapor in the condensation chambers 107, needed for condensation, is provided via forced convection of air flowing between condensation chambers 107 along the z-axis. Multiple arrays of metallic fins 109 in good thermal contact with the walls of the condensation chambers 107 serve for extending the effective area of heat transfer between the working fluid and the air flow. The number of fins 109, their geometry and material are optimized aiming at increasing the heat transfer and decreasing the air pressure losses.

In normal operating conditions, the secondary wick 105 is filled with subcooled liquid. The capillary size of the secondary wick 105 should be able to keep the liquid in any orientation of the x-axis with respect to gravity. Since the secondary wick 105 is in direct contact with the primary wick 104, the fluid flows into the secondary wick 105 and soaks the primary wick 104. The heat supplied to the base of the evaporator causes the liquid inside the primary wick in the vicinity of the bottom of the evaporator chamber to evaporate. The capillary force of the primary wick pore structure, creating a pressure difference across the liquid-vapor surface, is driving the liquid from the secondary wick to replenish the evaporated amount of the liquid. The vapor escapes through the grooves 114 cut in the primary wick 104. As the inlets of vapor ducts are directly opposite to the outlets of the grooves 114, the vapor from each groove 114 flows into a corresponding vapor duct with a minimum resistance.

The vapor ducts 106 lead the fluid flow to the condenser 120. As long as the walls of the condensation chambers 107 are colder than the incoming vapor, a condensation eventually takes place on the inner side of the walls. The cooling of the walls is produced by driving an air flow between the condensation chambers 107. In case the base of the evaporator 110 is oriented horizontally, the condensate inside the condensation chambers 107 flows downwards directly into the secondary wick 105. If the base plate is not horizontal, a fraction of the condensate flows to the bottom of the condensation chambers 107 and into the layer of secondary wick 105 which leads the condensate to the secondary wick 105 in the evaporator chamber 102. Since there are multiple condensation chambers 107, this arrangement provides rather even supply of the liquid to the primary wick 104, preventing a preliminary local dryout.

Figure 4:
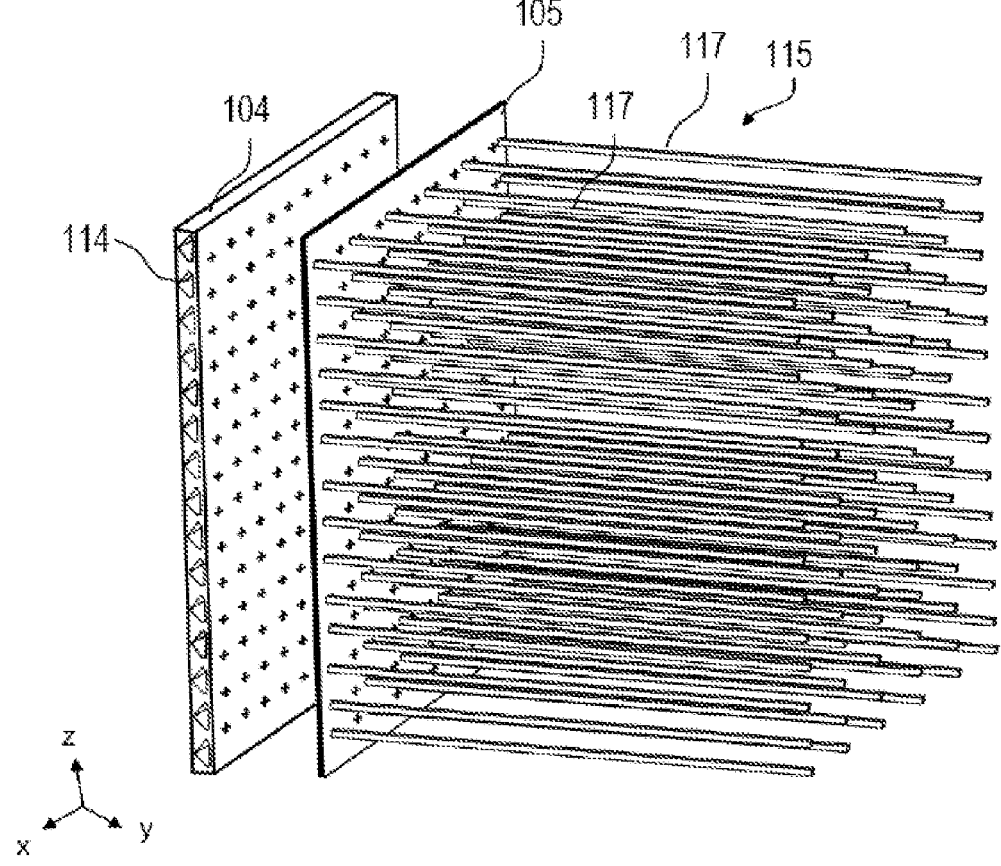
FIG. 4 shows a schematic diagram of primary and secondary capillary structures.

FIG. 4 shows a schematic diagram of primary 104 and secondary 115 capillary structures. The secondary capillary structure 115 of the evaporator chamber further comprises a path intruding portion 117 extending pin-like from the flat portion 105 of secondary capillary structure 115 into the plurality of paths. The flat portion 105 of secondary capillary structure 115 corresponds to the secondary wick 105 shown in FIG. 3c. This intruding portion 117 effects the reception of the condensed vapor in the compensation chambers. The liquid generated in the compensation chambers is conducted via the pin-like portion 117 over the flat portion 105 of secondary capillary structure 115 to the primary capillary structure 104 in the evaporation chamber due to a different structure of the primary 104 and secondary 115 capillary structures and pressure differences. This arrangement furthermore facilitates a homogeneous return of the liquid also in case that the paths are oriented horizontally or such that the liquid does no flow to the evaporation chamber by gravity.

The compactness of the loop heat pipe 100 can retrofit existing heat sinks without changes of geometrical layouts and dimensions. In case of additive manufacturing, the loop heat pipe 100 is produced by a single piece, thus eliminating thermal resistances associated with mechanical contacts, brazing or soldering. The cooling unit can operate in different orientations with respect to gravity.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A loop heat pipe, comprising:

an evaporator comprising an enclosure with a heat receiving side and side walls with openings forming an evaporator chamber, the openings being disposed in the side walls, the evaporator chamber comprising a primary capillary structure adjacent to the heat receiving side of the enclosure and extending to and contacting the side walls of the evaporator chamber, a plurality of grooves in the primary capillary structure, each of which begins from an opening in one of the side walls and ends at an opening in an opposite side wall to connect the respective openings, the plurality of grooves being configured to transport vapor from the primary capillary structure to the openings, the evaporator chamber further comprising a secondary capillary structure with a flat portion in direct contact with the primary capillary structure and extending to the side walls of the evaporator chamber; and a condenser comprising a plurality of condenser paths, each path having an inlet, wherein the loop heat pipe further comprises a plurality of vapor ducts connected to the evaporator and the condenser, wherein the plurality of vapor ducts connect the openings to the inlets of the condenser paths, wherein the plurality of vapor ducts are arranged in at least one vapor duct layer surrounding the condenser so as to form an envelope of the loop heat pipe together with the evaporator, and wherein each vapor duct layer of the at least one vapor duct layer starts on one side wall of the side walls and runs rectangularly along three sides of the evaporator.

2. The loop heat pipe of claim 1, wherein the secondary capillary structure is configured to provide subcooled liquid to the primary capillary structure for compensating evaporated liquid in the primary capillary structure.

3. The loop heat pipe of claim 2, wherein the secondary capillary structure further comprises a pin-shaped path intruding portion extending from the flat portion of secondary capillary structure into the plurality of condenser paths.

4. The loop heat pipe of claim 1, wherein the evaporator comprises support elements configured to mechanically stabilize the evaporation chamber.

5. The loop heat pipe of claim 1, wherein the inlets of the condenser paths are arranged on an opposite side of the evaporator configured to receive the vapor from the vapor ducts.

6. The loop heat pipe of claim 1, wherein each vapor duct of the plurality of vapor ducts connects to multiple condensation chambers.

7. The loop heat pipe of claim 6 comprising:

a conduit fluidly connecting vapor ducts with each other.

8. The loop heat pipe of claim 7, wherein the conduit is arranged at a corner on an opposite side of the evaporator.

9. The loop heat pipe of claim 2, wherein the primary capillary structure comprises a first porous structure with a first porosity and pores with a first pore size, and wherein the secondary capillary structure comprises a second porous structure with a second porosity different from the first porosity and pores with a second pore size different from the first pore size.

10. The loop heat pipe of claim 1 comprising:

metallic fins configured to cool the condensation chambers, wherein the metallic fins are arranged essentially perpendicular to the condenser paths so as to permit airflow along the metallic fins.

11. The loop heat pipe of claim 7 comprising:

access ports located at the ends of the conduit.

12. The loop heat pipe of claim 7, wherein the evaporator chamber, the vapor ducts, the condensation chambers, and the conduit form a hermetic system.

13. A method, comprising:

using the loop heat pipe of claim 1 to cool an electric power device.

14. An electric power device, comprising:

the loop heat pipe of claim 1.

15. The loop heat pipe of claim 1, wherein each vapor duct layer runs around the condenser paths and ends at a second side wall of the side walls.

16. The loop heat pipe of claim 15, wherein all vapor duct layers of the at least one vapor duct layer form a vertical envelope with open top and bottom sides.

17. The loop heat pipe of claim 16, wherein the open top and bottom sides are configured to introduce an airflow supporting a cooling of the condenser.

18. The loop heat pipe of claim 17, wherein corners of the at least one vapor duct layer are rounded.

* * * * *